United States Patent
Easoz et al.

[11] Patent Number: 6,077,345
[45] Date of Patent: Jun. 20, 2000

[54] SILICON CRYSTAL GROWTH MELT LEVEL CONTROL SYSTEM AND METHOD

[75] Inventors: John R. Easoz, McMurray; Takashi Isobe, Bethel Park, both of Pa.

[73] Assignee: Ebara Solar, Inc., Large, Pa.

[21] Appl. No.: 08/833,857

[22] Filed: Apr. 10, 1997

Related U.S. Application Data

[60] Provisional application No. 60/015,117, Apr. 10, 1996.

[51] Int. Cl.[7] .................................................. C30B 15/20
[52] U.S. Cl. ................................ 117/14; 117/15; 117/18; 117/214; 117/904
[58] Field of Search ................................. 117/14, 15, 18, 117/214, 903, 912

[56] References Cited

U.S. PATENT DOCUMENTS

| | | | |
|---|---|---|---|
| 4,508,970 | 4/1985 | Ackerman | 250/577 |
| 5,176,787 | 1/1993 | Kawashima et al. | 117/14 |
| 5,314,667 | 5/1994 | Lim et al. | 117/213 |
| 5,746,825 | 5/1998 | Von Ammon et al. | 117/14 |
| 5,961,715 | 10/1999 | Ikeda | 117/13 |

*Primary Examiner*—Felisa Hiteshew
*Attorney, Agent, or Firm*—Graham & James LLP

[57] ABSTRACT

The amount of silicon feed material supplied to a silicon melt furnace in a silicon crystal web growing installation is controlled by providing a melt level reference signal, generating a melt level signal representative of the level of the molten silicon in the silicon melt furnace, and providing a feed rate control signal representative of the difference between the melt level signal and the melt level reference signal. The feed rate control signal is used in a open loop mode to advise an operator of the amount of adjustment needed to correct the melt level; and is used in a closed loop mode to control the feed rate of the silicon feed material to the furnace. The laser beam reflected off the melt surface is passed through a narrow bandpass filter to remove noise due to thermal radiation from the furnace. The melt level signals generated by a position detector are averaged and digitally filtered to eliminate erroneous data caused by mechanical vibrations and other noise sources.

10 Claims, 2 Drawing Sheets

Align Laser

Align Mirror

Calibrate

6,077,345

SILICON CRYSTAL GROWTH MELT LEVEL CONTROL SYSTEM AND METHOD

CROSS-REFERENCE TO PROVISIONAL APPLICATION

Applicants hereby claim the benefit under 35 U.S.C. Section 119(e) of United States Provisional application Ser. No. 60/015,117 filed Apr. 10, 1996.

BACKGROUND OF THE INVENTION

This invention relates to silicon web growth technology. Dendritic web silicon substrates are produced for solar cell manufacturing, by growing thin ribbons of single crystal material from the surface of a molten pool of silicon. The silicon melt at a temperature of 1412° C. is located beneath a temperature regulating lid and heat shield stack. This process is described in more detail in Seidensticker, Journal of Crystal Growth, 39, 1977, the disclosure of which is hereby incorporated by reference. In this radiatively controlled system, view factors from the melt through the lid/shield structure play a very important role in defining the critical temperature distributions within the hot zone. A primary determinant of this view factor is the location of the melt surface relative to the lid. These temperature distributions affect the inherent ability to grow single, crystal material, the stability of growth, and crystal stress. Maintenance of a constant melt level over long periods of growth is necessary to achieve constant temperature distributions for steady state growth. In addition, growth of long crystals requires continuous melt replenishment to maintain a continuous source of liquid silicon.

Replenishment of the melt requires a high resolution, slowly responding control system which adds replenishment material at a steady, slowly varying rate (on the order of 0.2 g/min.) Discrete batch feeding introduces significant thermal perturbations to the melt and is therefore an unacceptable method. Silicon replenishment systems have been developed which enable this continuous replenishment, but a method of providing

SUMMARY OF THE INVENTION

The invention comprises a method and system using a sensor and control loop for monitoring the silicon melt level in a silicon web growth furnace and signaling a silicon replenishment feeder to supply new silicon as needed to maintain the melt level in the furnace. The invention further includes a calibration unit for calibrating the system.

The melt level position sensing system includes a laser, a converging lens, and a position detector to measure melt level in the furnace. The laser beam is directed onto the melt surface in the furnace, is reflected by the melt surface, is filtered by a narrow bandpass filter and is incident upon the position detector. Melt level signals generated by the position detector are processed to produce replenishment feeder signals, which are used to introduce fresh silicon melt materials into the furnace.

The position detector signals are processed by converting the analog signals output by the position detector to digital samples, averaging the values of a plurality of samples, and selectively using a current sample to obtain a new average value. A current sample is compared with the current average: if the current sample differs from the current average by more than a threshold value, the current sample is simply discarded. If the current sample lies within the threshold boundary value, the oldest sample is discarded and the current sample is used to obtain a new current average value.

The current average value of the position signals is compared with a setpoint value, preferably settable by an operator. When the system is used in an open loop mode, any difference between the current average value and the setpoint is displayed to the operator as an aid in adjusting the silicon material feed rate to the furnace. When used in a closed loop mode, the average value is used to generate a feedback control signal which directly drives an automatic silicon feed material unit.

The calibration system includes a calibration laser, a mirror and an adjustable mirror base for providing calibration height levels of different values for use in generating system calibration constants. The calibration laser is aligned by placing a liquid having a reflective surface in the furnace in the region normally occupied by the silicon melt, operating the calibration laser to generate a laser beam and aligning the calibration laser so that the laser beam reflected from the liquid surface is normal to the surface. The liquid is removed and the mirror is installed in the same location and adjusted until the mirror surface is normal to the calibration laser beam. Thereafter, the sensor system laser is activated to generate a beam which is reflected from the mirror surface onto the position detector, and the calibration mirror height is adjusted to different levels to provide the calibration constants.

For a fuller understanding of the nature and advantages of the invention, reference should be had to the ensuing detailed description taken in conjunction with the accompanying drawings.

DETAILED DESCRIPTION OF THE PREFERRED EMBODIMENT

Figure 1:
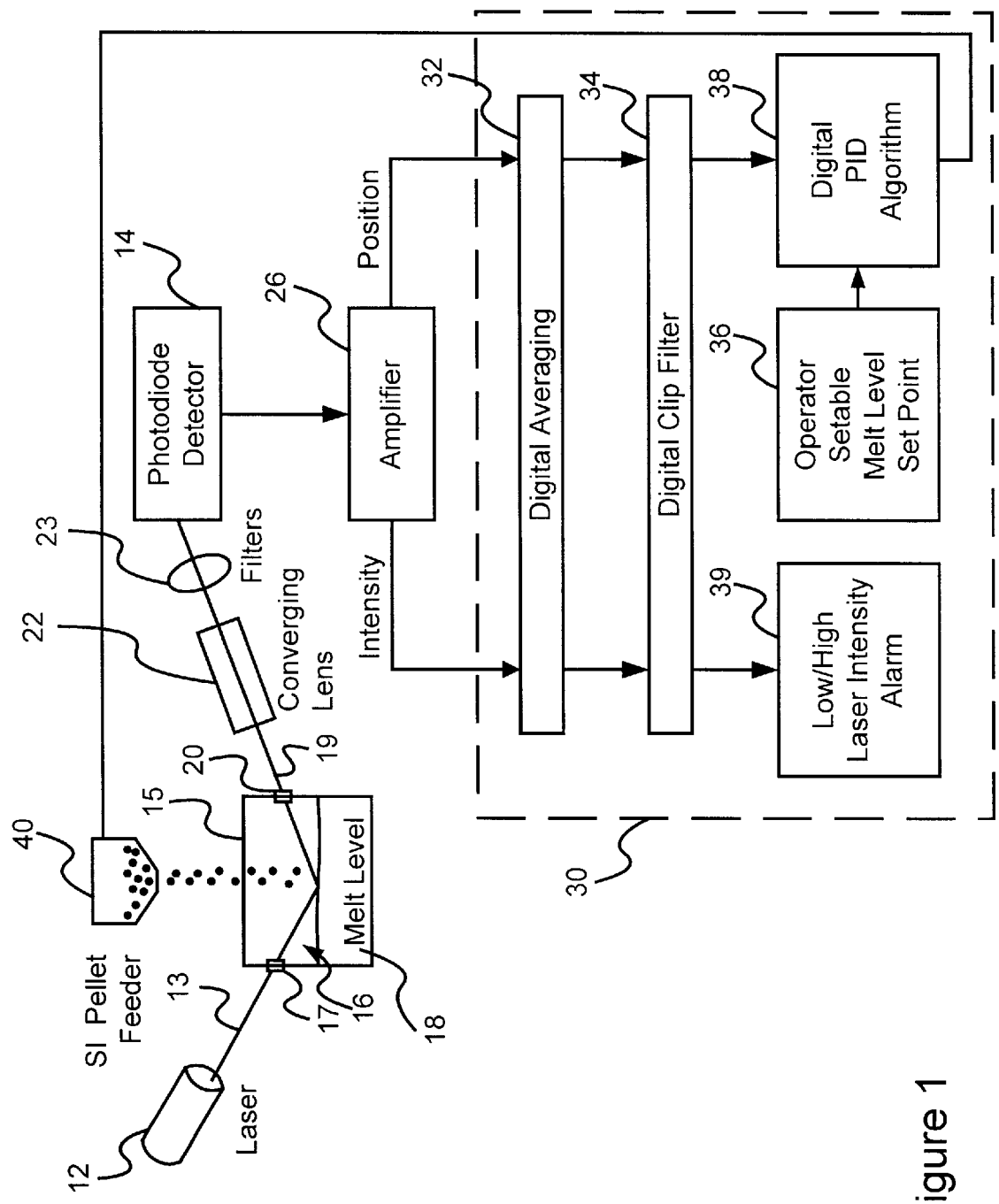
FIG. 1 is a schematic block diagram of the sensor system according to the invention.

With reference to FIG. 1, a laser 12 and a position sensitive detector 14 are mounted adjacent a furnace enclosure 15 at a first position, external to the growth hot zone 16. The laser beam 13 passes through a first quartz window 17, strikes the silicon melt 18 at an angle, and is reflected from the silicon melt 18. The reflected beam 19 passes through a second quartz window 20, a converging lens 22, appropriate filters 23, and finally to detector 14. Detector 14 is preferably a Model SL5-1 linear position detector available from UDT of Hawthorne, California. As the melt level changes height, the reflected beam 19 changes its vertical position on the detector 14 which can be indicated and translated to a corresponding melt level change. The detector output signal is coupled to an amplifier 26 and the output from amplifier 26 is coupled to a computer generally designated with reference numeral 30. Amplifier 26 is preferably a Model 301 DIV amplifier available form UDT of Hawthorne, Calif. The analog amplifier output signal is converted to a digital signal using an analog to digital interface (not shown). Calibration, digital filtering and display are performed in the computer through the use of software routines, and a resulting control signal is coupled to a silicon replenishment feeder unit 40 to control the amount of silicon feeder material (typically in the form of small pellets) supplied to furnace 15.

Optical filtering of the reflected laser beam is required prior to the detector to limit the beam intensity so as to avoid detector saturation, and more importantly to filter the thermal radiation from the hot furnace. A narrow bandpass filter 23 is used which passes only the wavelength of the incident laser beam. The radiation from the melt is a signal noise source; and the bandpass filter 23 increases the signal to noise ratio of the reflected laser beam signal at the detector 14. In the preferred embodiment, a filter 23 has a bandwidth of ten nanometers centered on a wavelength of 675 nanometers for a laser 12 having a wavelength of 670 nanometers. Ideally, the center wavelength of filter 23 should be the same as the laser wavelength. Due to normal random movements of the melt surface from convective flow, mechanical vibrations, and unstable melt/crucible interface effects, the reflected beam 19 shows significant variability in position, presenting a randomly oscillating cone of light to the converging lens 22. Because of this effect, digital filtering is required to determine the center of the light cone and eliminate erroneous data points which appear as "holes" in the detector signal due to beam interception at optical apertures. A digital filter was designed which provides signal averaging as well as some degree of immunity from these signal dropouts. This filtering performed as follows.

Each digitized position signal sample from detector 14 is averaged by a digital averaging block 32 with a selected number of previous samples to obtain a running average. Each new incoming position signal sample is compared with the average in a digital clip filter block 34. If the absolute difference between the new sample value and the average value lies below a predetermined threshold value, the new sample is accepted, the oldest sample is discarded, and a new running average is computed. If the absolute difference is equal to or greater than the predetermined threshold value, it is discarded. The average value is compared with the setpoint supplied from an operator settable melt level setpoint control unit 36, in digital PID (proportional integral derivative) routine 38. A feedback control signal generated by routine 38 is fed back along control line 41 to unit 40.

An output of digital clip filter block 34 is coupled to a LOW/HIGH laser intensity alarm unit 39 to generate a visible or audible warning signal when the intensity of laser beam 13 is too low or too high.

The FIG. 1 system can be configured to operate in the closed loop mode illustrated in FIG. 1 or in an open loop mode. In the open loop mode, information is provided visually to the furnace operator in order to facilitate manual adjustment of the melt level as required to maintain the process.

Figure 2A:
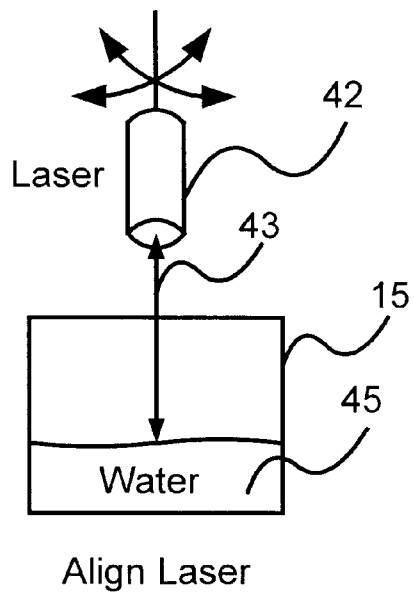
FIGS. 2A–2C are schematic diagrams of a calibration tool and technique for the system of FIG. 1.
Figure 2B:
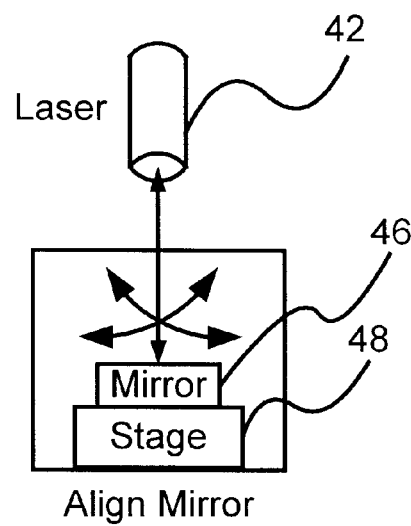
Figure 2C:
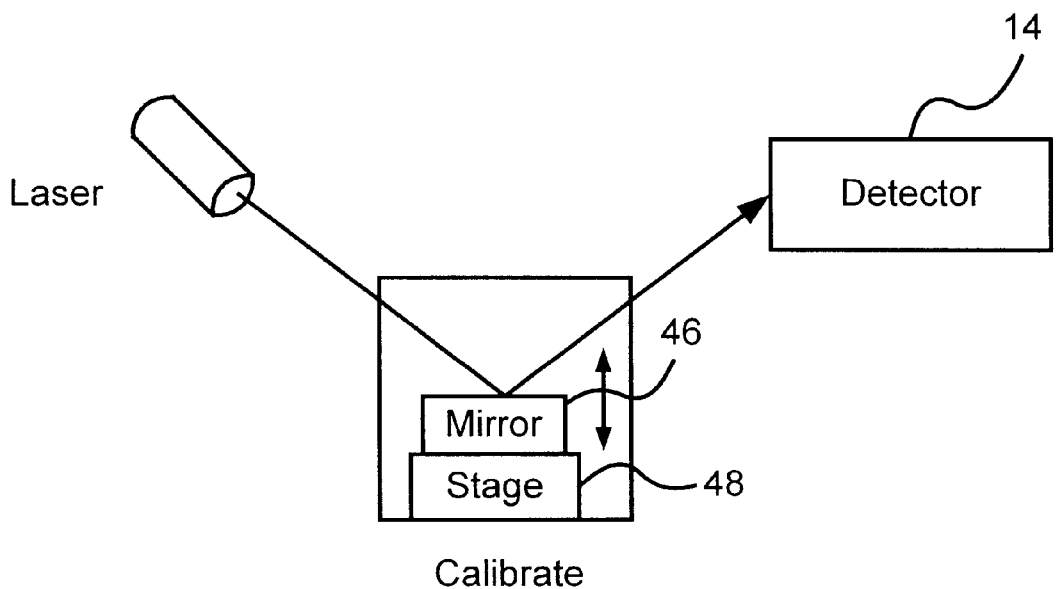

In order to provide an accurate and precise calibration of the melt level sensor system of FIG. 1, the calibration system shown in FIGS. 2A–2C is used. This calibration system includes a support block and mirror which is temporarily located in a "cold" furnace at the position where the laser beam would normally strike the melt. With reference to FIG. 2A, a second laser 42 is mounted above the melt location, and adjusted so that the beam 43 is reflected normal to the surface of a pool of water 45, which is temporarily placed in the location where the melt would typically be. Reflection normal to the water surface is determined by adjusting the laser direction until the reflected beam strikes the emitting aperture of the laser 42. The water is then replaced by a melt simulating mirror 46 (see FIG. 2B) which is aligned to reflect the laser beam normal to the plane of the mirror 46, thus enabling the mirror 46 to simulate a gravitationally level melt. The mirror 46 is mounted on a remotely controlled micrometer stage 48 to allow fine adjustment of the mirror height thus giving the ability to simulate small melt level changes. Following leveling of the mirror 46, the furnace chamber is closed with the alignment tool inside (see FIG. 2C). The melt level measurement system is then activated, and calibration constants are developed by adjusting the mirror 46 to two or more known heights and reading the resultant melt level sensor signal incident upon detector 14. Linear calibration constants representing offset and gain are then introduced into the calibration and display software.

The control loop portion of the system consists of a single digital proportional-integral-derivative (PID) control algorithm 38 to control the feed rate of silicon into the furnace. The input to the PID loop is the calibrated and filtered signal from detector 14; the output of the PID loop provides continuous amplitude commands to the silicon feeder unit 40. The furnace operator sets the desired setpoint melt level in unit 36.

This entire system including laser 12, detector 14, optics 22, 23, computer software, and calibration system has been operated on a dendritic web crystal growth furnace. This invention has been found to be capable of providing melt level detection resolutions as fine as 0.1 mm and real-time control of the absolute melt position to within 0.5 mm. Details of calibration procedures, long term stability effects, fixturing, and controller tuning are best determined on an empirical basis.

The melt level sensing and control system provides continuous feedback of melt level not previously possible in crystal growth systems. This enables the operation of a furnace in a thermally optimized, continuously replenished state. In this operating mode, the growth of long continuous crystals is possible without the need to replenish the melt between crystals, thus reducing both labor content of the crystal growth process and non-productive time between crystals, and promoting uniformity of operating conditions. This sensing system can be applied to any crystal growth system that requires accurate control of the melt level. The melt level calibration tool provides accurate and precise melt level measurements to a minimum resolution of 0.1 mm. The invention further provides unique combinations of digital and optical filtering in order to enable the generation of acceptable signals for the system to operate in an inherently noisy environment. The feed back control loop can control absolute melt position to within 0.5 mm.

While the above provides a full and complete disclosure of the preferred embodiments of the invention, various modifications, alternate constructions and equivalents will occur to those skilled in the art. Therefore, the above should not be construed as limiting the invention, which is defined by the appended claims.

What is claimed is:

1. A method of controlling the amount of silicon feed material supplied to a silicon melt furnace in a silicon crystal web growing installation, said method comprising the steps of:

(a) providing a melt level reference signal;
   (b) generating a melt level signal representative of the level of molten silicon in the silicon melt furnace; and
   (c) providing a feed rate control signal representative of any difference between the melt level signal and the melt level reference signal.

2. The method of claim 1 further including the step of visually displaying the feed rate control signal to an operator for manually controlling the feed rate of the silicon feed material to the furnace.

3. The method of claim 1 further including the step of using the feed rate control signal to control the feed rate of the silicon feed material to the furnace.

4. The method of claim 1 wherein said step (b) of generating includes the step of directing a laser beam onto the surface of the molten silicon in the furnace, and causing the beam deflected from the surface to impinge upon a position detector.

5. The method of claim 4 further including the step of passing the reflected beam through a narrow bandpass filter.

6. The method of claim 1 wherein said step (c) of providing includes the steps of averaging the value of successive melt level signals, comparing the value of a current melt level signal with the current average, using the value of a current melt level signal to obtain a new average if the value of the current melt level signal differs from the current average by less than a threshold amount, and discarding the current multi-level signal when the difference is greater than the threshold amount.

7. A method of calibrating a melt level signal sensing system used to control the amount of silicon feed material supplied to a silicon melt furnace in a silicon crystal web growing installation, said method comprising the steps of:

(a) providing a level reflective surface in the furnace;

(b) reflecting a laser beam off the reflective surface onto a position detector to generate a position signal; and (c) changing the position of the reflective surface relative to a position reference while observing the position signals generated.

8. The method of claim 7 further including the step of aligning the level reflective surface relative to the position reference.

9. The method of claim 8 wherein said step of aligning includes the steps of providing a fluid with a reflective surface in the furnace, aligning a laser beam normal to the reflective surface of the fluid, removing the fluid, installing the level reflective surface and using the aligned laser beam to adjust the position of the level reflective surface until the surface is normal to the laser beam.

10. The method of claim 7 wherein the position reference lies in a plane parallel to the level reflective surface; and wherein said step (c) of changing the position of the level reflective surface includes the step of altering the normal distance between the level reflective surface and the plane of the position reference.

* * * * *